(12) United States Patent
Mabande et al.

(10) Patent No.: US 10,886,883 B2
(45) Date of Patent: Jan. 5, 2021

(54) APPARATUS FOR PROCESSING AN INPUT AUDIO SIGNAL AND CORRESPONDING METHOD

(71) Applicant: Fraunhofer-Gesellschaft zur Förderung der angewandten Forschung e.V., Munich (DE)

(72) Inventors: Edwin Mabande, Weisendorf (DE); Fabian Küch, Erlangen (DE); Michael Kratschmer, Möhrendorf (DE); Michael Meier, Aurachtal (DE); Bernhard Neugebauer, Buckenhof (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/601,882

(22) Filed: Oct. 15, 2019

(65) Prior Publication Data

US 2020/0112294 A1 Apr. 9, 2020

Related U.S. Application Data

(63) Continuation of application No. PCT/EP2018/025106, filed on Apr. 10, 2018.

(30) Foreign Application Priority Data

Apr. 13, 2017 (EP) ..................... 17166448

(51) Int. Cl.
*H03G 3/30* (2006.01)
*H04R 3/00* (2006.01)
(Continued)

(52) U.S. Cl.
CPC ............. *H03G 3/301* (2013.01); *G06F 3/165* (2013.01); *H04R 29/001* (2013.01); *H03G 2201/103* (2013.01)

(58) Field of Classification Search
CPC . H04R 3/00; H04R 3/04; H04R 29/00; H04R 29/001; H04R 2430/01; H03G 3/20;
(Continued)

(56) References Cited

U.S. PATENT DOCUMENTS 7,848,531 B1 12/2010 Jot et al.
8,229,125 B2 7/2012 Short
(Continued)

FOREIGN PATENT DOCUMENTS

JP 2005-143090 A 6/2005
JP 2008-503169 A 1/2008
(Continued)

OTHER PUBLICATIONS

EBU Tech Doc 3342 Loudness Range: A Descriptor to supplement Loudness Normalization, Supplementary Information for R 128 Version 3.0, Jan. 2016.
(Continued)

*Primary Examiner* — Thang V Tran
(74) *Attorney, Agent, or Firm* — Novick, Kim & Lee, PLLC; Jae Young Kim; Jihun Kim

(57) ABSTRACT

An apparatus for processing an input audio signal includes an evaluator for evaluating a loudness of the input audio signal to determine a loudness range and an actual loudness value. A calculator determines a compressor transfer function based on the determined loudness range, based on a target loudness range and based on the determined actual loudness value. The calculator further determines at least one loudness range control gain based on the determined compressor transfer function. An adjuster provides an output
(Continued)

audio signal based on the input audio signal and based on the at least one determined loudness range control gain. The calculator is configured to determine the compressor transfer function such that a difference between a mean loudness of the output audio signal and a mean loudness of the input audio signal is minimized. A corresponding method is also provided.

15 Claims, 7 Drawing Sheets

(51) Int. Cl.
*H04R 29/00* (2006.01)
*G06F 3/16* (2006.01)

(58) Field of Classification Search
CPC ............ H03G 3/30; H03G 3/301; H03G 7/00; H03G 7/002; H03G 7/007; H03G 2201/103; G06F 3/16; G06F 3/165
See application file for complete search history.

(56) References Cited

U.S. PATENT DOCUMENTS

| | | | |
|---|---|---|---|
| 9,565,508 B1* | 2/2017 | Skovenborg | H04S 3/006 |
| 2005/0110667 A1 | 5/2005 | Borisavljevic | |
| 2006/0008028 A1 | 1/2006 | Maltsev et al. | |
| 2007/0121966 A1* | 5/2007 | Plastina | H03G 7/007 |
| | | | 381/104 |
| 2007/0291959 A1 | 12/2007 | Seefeldt | |
| 2009/0116664 A1* | 5/2009 | Smirnov | H04R 3/00 |
| | | | 381/106 |
| 2009/0190779 A1* | 7/2009 | Chung | H03G 3/20 |
| | | | 381/107 |
| 2010/0017205 A1 | 1/2010 | Toman et al. | |
| 2011/0255712 A1* | 10/2011 | Urata | H03G 9/025 |
| | | | 381/107 |
| 2012/0328115 A1* | 12/2012 | Wolters | H03G 9/005 |
| | | | 381/57 |
| 2014/0044268 A1 | 2/2014 | Engel et al. | |
| 2014/0072126 A1 | 3/2014 | Uhle et al. | |
| 2014/0140537 A1* | 5/2014 | Soulodre | H03G 9/005 |
| | | | 381/104 |
| 2014/0369527 A1 | 12/2014 | Baldwin | |
| 2015/0332685 A1 | 11/2015 | Bleidt | |
| 2017/0094409 A1 | 3/2017 | Baumgarte | |
| 2018/0166090 A1* | 6/2018 | Tu | G10L 21/038 |

FOREIGN PATENT DOCUMENTS

| | | |
|---|---|---|
| JP | 2008-518565 A | 5/2008 |
| JP | 2010-87811 A | 4/2010 |
| JP | 2011-135218 A | 7/2011 |
| JP | 2014-003647 A | 1/2014 |
| RU | 2550528 C2 | 5/2015 |
| RU | 2015136531 A | 3/2017 |
| WO | 0065872 A1 | 11/2000 |

OTHER PUBLICATIONS

ITU-R, Recommendation ITU-R BS.1770-3, Algorithm to measure audio programme loudness and true-peak audio level, Aug. 2012.
EBU Tech Doc 3341 Loudness Metering: 'EBU Mode' metering to supplement loudness normalisation in accordance with EBU R 128 Version 3.0, Jan. 2016.

* cited by examiner

APPARATUS FOR PROCESSING AN INPUT AUDIO SIGNAL AND CORRESPONDING METHOD

CROSS-REFERENCES TO RELATED APPLICATIONS

This application is a continuation of copending International Application No. PCT/EP2018/025106, filed Apr. 10, 2018, which is incorporated herein by reference in its entirety, and additionally claims priority from European Application No. EP 17166448.5, filed Apr. 13, 2017, which is incorporated herein by reference in its entirety.

The invention refers to an apparatus for processing an input audio signal. The invention also refers to a corresponding method and to a computer program.

The invention relates to the field of processing audio signals, more specifically to an approach which controls the loudness range of an audio signal, i.e., adjusts the loudness range of an audio signal to match a desired target loudness range. The loudness range [1] is a measure of the dynamics of an audio signal. As set forth in [1], in the meaning of the present application, the loudness range quantifies the variation in a time-varying loudness measurement. Thus, the loudness range describes the statistical distribution of measured instantaneous loudness values.

BACKGROUND OF THE INVENTION

Controlling the loudness range is desirable for a wide range of scenarios, e.g.:
- playback with devices which have constraints on audio playback system capabilities
- playback under special viewing modes, e.g., late-night-mode
- playback in environments with high ambient noise
- preprocessing for real-time loudness normalization A method that enables controlling the loudness range of an audio signal to achieve a target loudness range is termed a Loudness Range Control (LRAC) method here. In literature, the majority of methods seeks to control the dynamic range of the audio signal, i.e., Dynamic Range Control (DRC). The definition of the loudness range is standardized [1] whereas the definition of the dynamic range sometimes differs. Of course, controlling the dynamic range is related to controlling the loudness range. Therefore, for the sake of simplicity both can be addressed as LRAC methods.

Automatic gain control (AGC) represents methods that relate to controlling the overall level of an audio signal. Due to the fact that the gain is typically time variant, this usually leads to a change in the dynamic range, i.e., the dynamic range is typically reduced. However, the amount of change in the dynamic range is not predictable, i.e., the dynamic range of the output signal is unknown and cannot be controlled in a desired way.

Of course, the aim of applying a compressor with a fixed preselected transfer function (also known as profile) is to change the loudness range of the audio signal. The selection of the transfer function is based on some predefined criteria, e.g., viewing mode. However, applying a predefined compressor transfer function also cannot guarantee that a target loudness range is achieved at the output.

In order to achieve a desired target loudness range, a transfer function that is unique to the given audio signal is determined. The transfer function is then applied to the audio signal to produce the loudness-range-controlled audio. In addition, the transfer function should be designed so as to achieve the desired target loudness range with minimal degradation of the audio signal quality.

In conventional technology, different methods are known. Predefined/fixed transfer functions:

The transfer functions are predefined and are selected based on the expected playback content, e.g., movie, news, music, or on the listening mode, e.g., late-night-mode.

Reference-signal based transfer functions:

Other methods [2] propose to use a combination of a measured reference signal, e.g., the level of background noise in the listening environment, and a volume control setting on the playback device.

Parameter-based transfer functions:

Here, the transfer function is designed based only on user-defined input parameters.

For the method proposed in [3], the average level and the dynamic range of an input audio signal are determined. Based on the average level and a setting of the desired dynamic range of the user, a transfer function is computed and applied to the input audio signal.

FIG. 1 shows the slider-based desired dynamic range tolerance and corresponding transfer function. On the x-axis of the diagram the Input loudness in [dB] and on the y-axis the Output loudness in [dB] is given. The exemplary slider on the left allows to set the "dynamic range tolerance region" that effects the form of the transfer function. The lower region of the Input loudness reaches to the upper limit of the noise floor. This is followed by a section with constant output loudness. The dynamic range tolerance region corresponds to the desired dynamic range in this case. The linear portion of the transfer function is placed at average signal level (horizontal shift), which is time-dependent followed one more by a section with constant output loudness.

The measured dynamic range is not used in the computation of the transfer function, i.e., a dedicated control of the dynamic or loudness range of the input audio signal is not possible.

In [4], the dynamic spread, which is the average absolute deviation from the average loudness, is controlled. A specific compressor with two line segments is used as shown in FIG. 2 (Output loudness vs. Input loudness). The two parameters to be estimated are compressor threshold (indicated by the black dot) and slope (i.e. the deviation from the linear curve given with a broken line). The threshold is specified by the user as a percentile and converted to dB by using the dynamics profile [dB vs percentile]. The slope is computed based on the assumption that there is a linear relationship between changes in the dynamic spread and changes in the slope.

$$\frac{S_{des} - S_{min}}{S_{max} - S_{min}} = \frac{D_{des} - D_{min}}{D_{max} - D_{min}} \quad (1)$$

where $S_{des}$ and $D_{des}$ are the desired slope and dynamic spread, respectively, and $D_{in}$ is the measured dynamic spread.

Typically, $S_{min} = D_{min} = 0$, $S_{max} = 1$ and $D_{max} = D_{in}$, thus:

$$S_{des} = \frac{D_{des}}{D_{in}} \quad (2)$$

The transfer function is then adapted via an iterative process.

First, the transfer function is applied to the input histogram of the audio data or to the audio data in order to determine the achieved dynamic spread. The slope of the transfer function is then adjusted and the procedure is repeated until the desired dynamic spread is achieved.

There are two drawbacks implied by this approach to dynamic range control:
1) Only the slope of the transfer function is determined but not its position relative to the origin, i.e., the shift, of the plane spanned by the input/output levels. Therefore, the range of the resulting gains cannot be predicted.
2) The iterative process to obtain the final transfer function from the initial one is computationally very complex and may not necessarily lead to the best result, as the selection of the initial transfer function, with its user defined threshold, limits the properties of the possible final transfer functions.

A make-up gain is computed by applying the final transfer function to the input histogram and subsequently approximating the output loudness from it.

SUMMARY

According to an embodiment, an apparatus for processing an input audio signal may have: an evaluator, a calculator and an adjuster, wherein the evaluator is configured to evaluate a loudness of the input audio signal to determine a loudness range and an actual loudness value, wherein the calculator is configured to determine a compressor transfer function based on the determined loudness range, based on a target loudness range and based on the determined actual loudness value, wherein the calculator is configured to determine at least one loudness range control gain based on the determined compressor transfer function, and wherein the adjuster is configured to provide an output audio signal based on the input audio signal and based on the at least one determined loudness range control gain, wherein the calculator is configured to determine the compressor transfer function such that a difference between a mean loudness of the output audio signal and a mean loudness of the input audio signal is minimized.

According to another embodiment, a method for processing an input audio signal may have the steps of: evaluating a loudness of the input audio signal to determine a loudness range and an actual loudness value, determining a compressor transfer function based on the determined loudness range, based on a target loudness range and based on a determined statistical moment of the loudness value, determining at least one loudness range control gain based on the determined compressor transfer function, and providing an output audio signal based on the input audio signal and based on the at least one determined loudness range control gain, wherein the compressor transfer function is determined such that a difference between a mean loudness of the output audio signal and a mean loudness of the input audio signal is minimized.

Another embodiment may have a computer program for performing, when running on a computer or a processor, the inventive method.

The evaluator is configured to evaluate a loudness of the input audio signal to determine a loudness range and an actual loudness value. The loudness range is determined in one embodiment for the entire input audio signal and in a different embodiment for a given time period (e.g. a frame) of the input audio signal. The actual loudness value is e.g. a momentary or short-term loudness value of the input audio signal [6]. It should be clear that any measure indicating or providing a suitable measure of the level or power of at least a time period of the input audio signal, e.g., the mean power, can be used in place of the aforementioned actual loudness measure. The calculator is configured to determine a compressor transfer function based on the determined loudness range, based on a target loudness range and based on the determined actual loudness value. In some embodiments the compressor transfer function is additionally based on the determined statistical moment of the loudness value. The statistical moment is e.g. the mean of the loudness value or the integrated gated loudness of the audio input according to ITU-R BS.1770 [5]). The calculator is configured to determine at least one loudness range control gain based on the determined compressor transfer function. The adjuster is configured to provide an output audio signal based on the input audio signal and based on the at least one determined loudness range control gain. In a different embodiment, the calculator provides the loudness range control gains to the adjuster for providing the output audio signal.

In one embodiment, the evaluator is configured to evaluate the loudness of the input audio signal to determine a statistical moment of the loudness value. Further, the calculator is configured to determine the compressor transfer function based on the determined loudness range, based on the target loudness range and based on a difference between the determined actual loudness value and the determined statistical moment of the loudness value.

In a different embodiment, the calculator is configured to determine the compressor transfer function based on a curve and a shift, the calculator is configured to determine the curve based on the determined loudness range and on the target loudness range, and the calculator is configured to determine the shift based on the determined statistical moment of the loudness value.

According to an embodiment, the calculator is configured to determine the compressor transfer function based on a slope and a shift, the calculator is configured to determine the slope based on the determined loudness range and on the target loudness range, and the calculator is configured to determine the shift based on the determined statistical moment of the loudness value.

In an embodiment, the determined compressor transfer function is valid for the entire input audio signal.

According to an embodiment, the evaluator is configured to evaluate the loudness of the entire input audio signal.

In an embodiment, the evaluator is configured to evaluate the loudness of at least a time period of the input audio signal.

According to an embodiment, the evaluator is configured to determine momentary or short-term loudness value as the actual loudness value.

In an embodiment, the evaluator is configured to determine a mean loudness as the statistical moment of the loudness value.

In a different embodiment, the evaluator is configured to determine an integrated gated loudness as the statistical moment of the loudness value.

According to an embodiment, the calculator is configured to determine the compressor transfer function such that a mean loudness of the output audio signal and the determined mean loudness of the input audio signal are equal.

In an embodiment, the calculator is configured to provide the adjuster with the determined loudness range control gain.

In an embodiment, the calculator is configured to provide the adjuster with the determined loudness range control gain only in case the calculated loudness range control gain is smaller than or equal to a maximum gain value. According to an embodiment, when the determined loudness range control gain is larger than the maximum gain value, the calculator is configured to provide the adjuster with the maximum gain value. In an alternative embodiment, when the determined loudness range control gain is larger than the maximum gain value, the calculator does not provide a gain to the adjuster and the adjuster assumes a maximum gain value or uses a gain stored for such a situation.

In a further embodiment, the calculator is configured to determine the loudness range control gain based on the determined compressor transfer function and based on a maximum gain value such that the determined loudness range control gain is smaller than or equal to the maximum gain value. Hence, the calculator determines, for example, the determined loudness range control gain to be submitted to the adjuster by calculating a minimum of the actually determined gain value and the maximum gain value.

According to an embodiment, the maximum gain value is set by a user input. In an alternative embodiment, the maximum gain value is depending on a difference between the target loudness range and the determined loudness range of the input audio signal.

According to an embodiment, the apparatus further comprises an input interface configured to receive a value for the target loudness range. Hence, via the input interface the user inputs the desired target loudness range.

Some further embodiments of the apparatus and accordingly the method follow:

In an embodiment, the evaluator is configured to evaluate a loudness of the input audio signal to determine a loudness range and a mean loudness. The calculator is configured to calculate a slope value being proportional to a ratio between a target loudness range and the determined loudness range of the input audio signal. The calculator is configured to calculate a shift value being depending on the determined mean loudness of the input audio signal (in one embodiment, the shift depends on the determined mean loudness times the difference between 1 and the slope). The calculator is configured to calculate loudness range control data based on a linear transfer function depending on the calculated shift value and on the calculated slope value. Finally, the adjuster is configured to provide an output audio signal based on the input audio signal and based on the loudness range control data.

In an embodiment, the linear transfer function is valid for the entire input audio signal. In this embodiment, one linear transfer function is used for the entire input audio signal, i.e. for all loudness values. In one embodiment, the linear transfer function is valid for the entire input audio signal with exception of very high and/or low loudness values.

According to an embodiment, the evaluator is configured to determine the loudness range and the mean loudness of the entire input audio signal. This embodiment is especially relevant for the offline treatment of the input audio signal.

In an embodiment, the evaluator is configured to determine the loudness range and the mean loudness of at least a part of the input audio signal.

According to an embodiment, the calculator is configured to calculate the slope value as a product of a proportionality constant times the ratio between the target loudness range and the determined loudness range of the input audio signal. The target loudness range is input by a user and refers to the loudness range of the output audio signal, the determined loudness range is given by the input audio signal.

In an embodiment, the proportionality constant is set to one. Hence, the slope value is given by the ratio between the target loudness range and the determined loudness range.

According to an embodiment, the calculator is configured to calculate the shift value such that a mean loudness of the output audio signal and the determined mean loudness of the input audio signal are equal.

In an embodiment, the calculator is configured to calculate the shift value using the following formula: $a=\mu_{in}*(1-b)$. The shift value is given by a, the determined mean loudness of the input audio signal is denoted by $\mu_{in}$, and b is the calculated slope value.

According to an embodiment, the calculator is configured to provide a loudness range control gain and the adjuster is configured to apply the loudness range control gain to the input audio signal.

In an embodiment, the evaluator is configured to determine an input loudness value of a frame of the input audio signal having a short-term duration. The calculator is configured to provide an output loudness value of a frame of the output audio signal corresponding to the frame of the input audio signal. Further, the calculator is configured to calculate the output loudness value using the following formula: $N_{out}(k)=a+b*N_{in}(k)$. Wherein: $N_{out}(k)$ is the output loudness value, a is the shift value, b is the slope value, $N_{in}(k)$ is the determined input loudness value of the corresponding frame of the audio input signal, and k is an index of the frame. The frame is thus a part of the input signal from which e.g. the loudness range and/or the mean loudness are/is determined.

According to an embodiment, the calculator is configured to provide a loudness range control gain as the difference between the calculated loudness value of the frame of the output audio signal and the determined loudness value of the corresponding frame of the input audio signal.

In an embodiment, the calculator is configured to provide a loudness range control gain using the following formula: $G(k)=a+(b-1)*N_{in}(k)$, wherein G(k) is the loudness range control gain, a is the calculated shift value, b is the calculated slope value, $N_{in}(k)$ is the determined input loudness value of a frame of the audio input signal, and k is an index of the frame. The loudness range control gain is thus an example of the loudness range control data to be used by the adjuster.

According to an embodiment, the adjuster is configured to apply the loudness range control gain to the input audio signal to provide the output audio signal.

In an embodiment, the calculator is configured to provide the adjuster with the calculated loudness range control gain. According to an embodiment, the provided calculated loudness range control gain is smaller than or equal to a maximum gain value.

According to an embodiment, the maximum gain value is set by a user input.

In an embodiment, the maximum gain value is depending on a difference between the target loudness range and the determined loudness range of the input audio signal.

According to an embodiment, the calculator is configured to provide the adjuster with the calculated loudness range control gain. The provided calculated loudness range control gain is in one embodiment greater than or equal to a minimum gain value.

In an embodiment, the evaluator is configured to determine an integrated loudness of the input audio signal. Further, the calculator is configured to calculate a makeup gain value based on the determined integrated loudness of the input audio signal and on a target integrated loudness of the output signal. Finally, the adjuster is configured to modify the loudness of the output audio signal by applying the makeup gain value.

According to an embodiment, the evaluator is configured to determine an integrated loudness of the input audio signal. The calculator is configured to calculate a makeup gain value based on the shift value, the slope value, and the determined integrated loudness. The adjuster is configured to modify the loudness of the output audio signal by applying the makeup gain value.

In an embodiment, the calculator is configured to calculate the makeup gain value using the following formula: $G_{mu} = a + (b-1)I_{in}$, wherein $G_{mu}$ is the makeup gain value, a is the shift value, b is the slope value, and $I_{in}$ is the determined integrated loudness of the input audio signal.

The object is also achieved by a method for processing an input audio signal. The expression input audio signal comprises audio signals as well as speech signals.

The method for processing an input audio signal comprises at least the following steps:
  evaluating a loudness of the input audio signal to determine a loudness range and an actual loudness value,
  determining a compressor transfer function based on the determined loudness range, based on a target loudness range, based on the determined actual loudness value, and based on the statistical moment of the determined loudness value,
  determining at least one loudness range control gain based on the determined compressor transfer function, and
  providing an output audio signal based on the input audio signal and based on the at least one determined loudness range control gain.

In a different embodiment, the following steps are performed:
  evaluating a loudness of the input audio signal to determine a loudness range and a mean loudness,
  calculating a slope value being proportional to a ratio between a target loudness range and the determined loudness range,
  calculating a shift value being depending on the determined mean loudness,
  calculating loudness range control data based on a linear transfer function depending on the calculated shift value and on the calculated slope value, and
  providing an output audio signal based on the input audio signal and based on the loudness range control data.

The above discussed embodiments of the apparatus are also valid for the method.

The invention also refers to a computer program for performing, when running on a computer or a processor, the method for processing an input audio signal.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
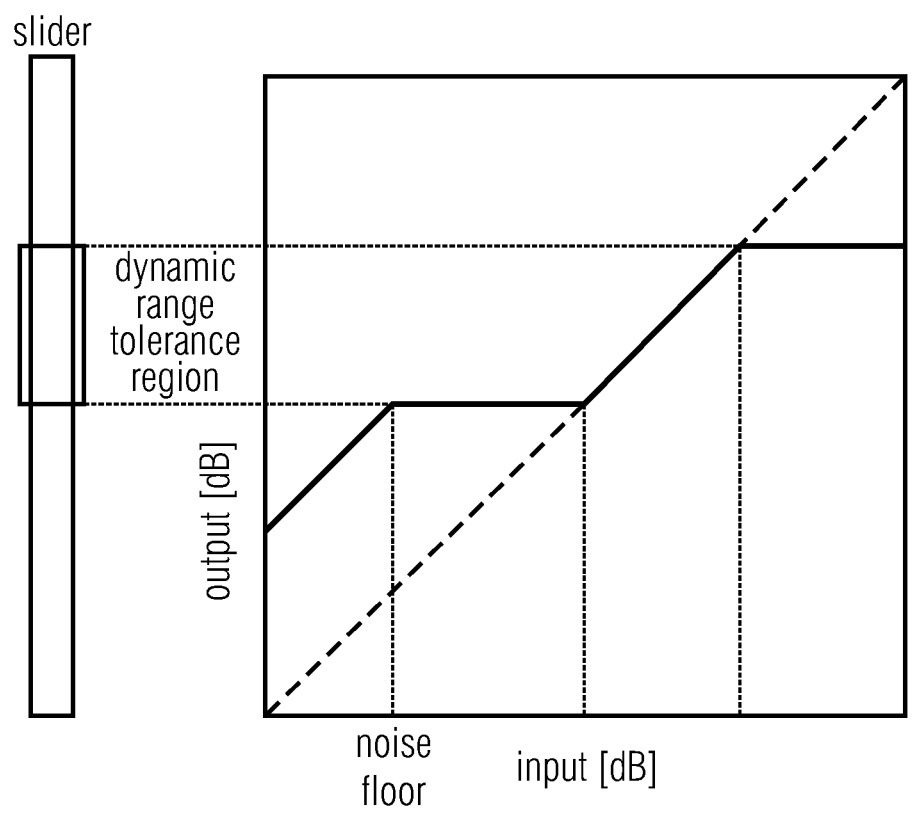
FIG. 1 shows a transfer function of LRAC of conventional technology.
Figure 2:
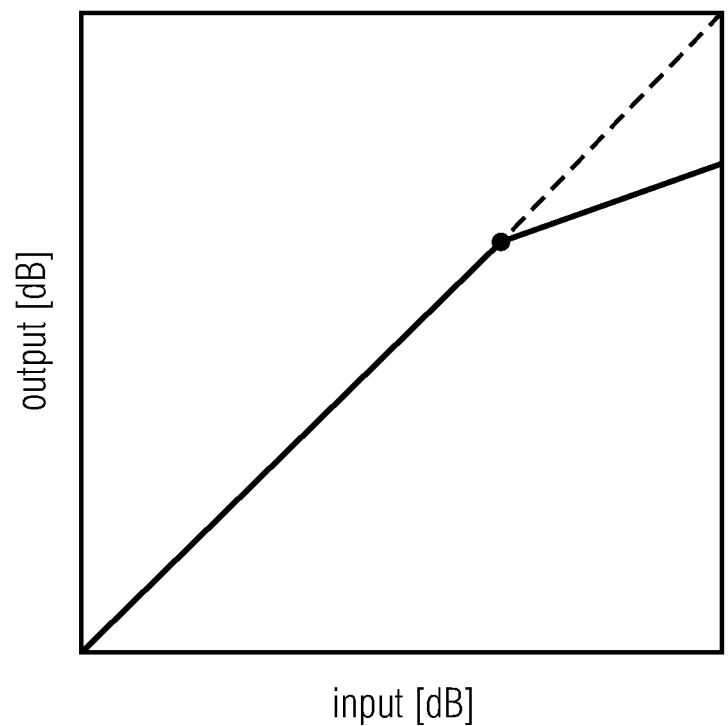
FIG. 2 shows a different transfer function of LRAC of conventional technology.

FIGS. 1 and 2 depict transfer functions according to conventional technology.

Figure 3:
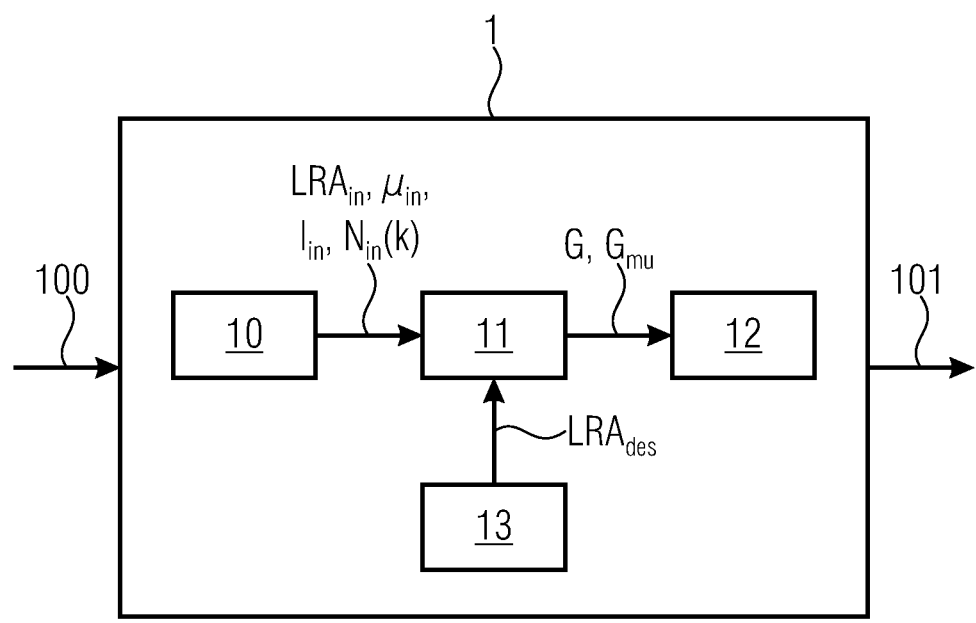
FIG. 3 shows a block diagram of an apparatus for processing an input audio signal.

FIG. 3 shows an exemplary embodiment of an apparatus 1 for processing an input audio signal 100 and for providing an output audio signal 101. The evaluator 10 evaluates in this shown embodiment the loudness of the input audio signal 100 in order to determine a loudness range $LRA_{in}$ and a mean loudness $\mu_{in}$ of the input audio signal 100. In this shown embodiment, the evaluator 10 also determines an integrated loudness $I_{in}$ of the input audio signal 100 and the input loudness value $N_{in}(k)$ for different frames k of the input audio signal 100.

The determined values are submitted to the calculator 11 which also refers to a desired target loudness range $LRA_{des}$ input by a user via the input interface 13.

The calculator 11 calculates loudness range control data to be used by the adjuster 12—i.e. the adjuster of the loudness—acting on the input audio signal 100 and providing the output audio signal 101. Further, the calculator 11 provides loudness range control data in form of loudness range control gain G and here also make-up gain $G_{mu}$. This is the result of the determination of the compressor transfer function.

The inventive LRAC applies in this embodiment a linear transform to the input audio signal 100 in order to achieve loudness range control for the output audio signal 101.

Figure 4:
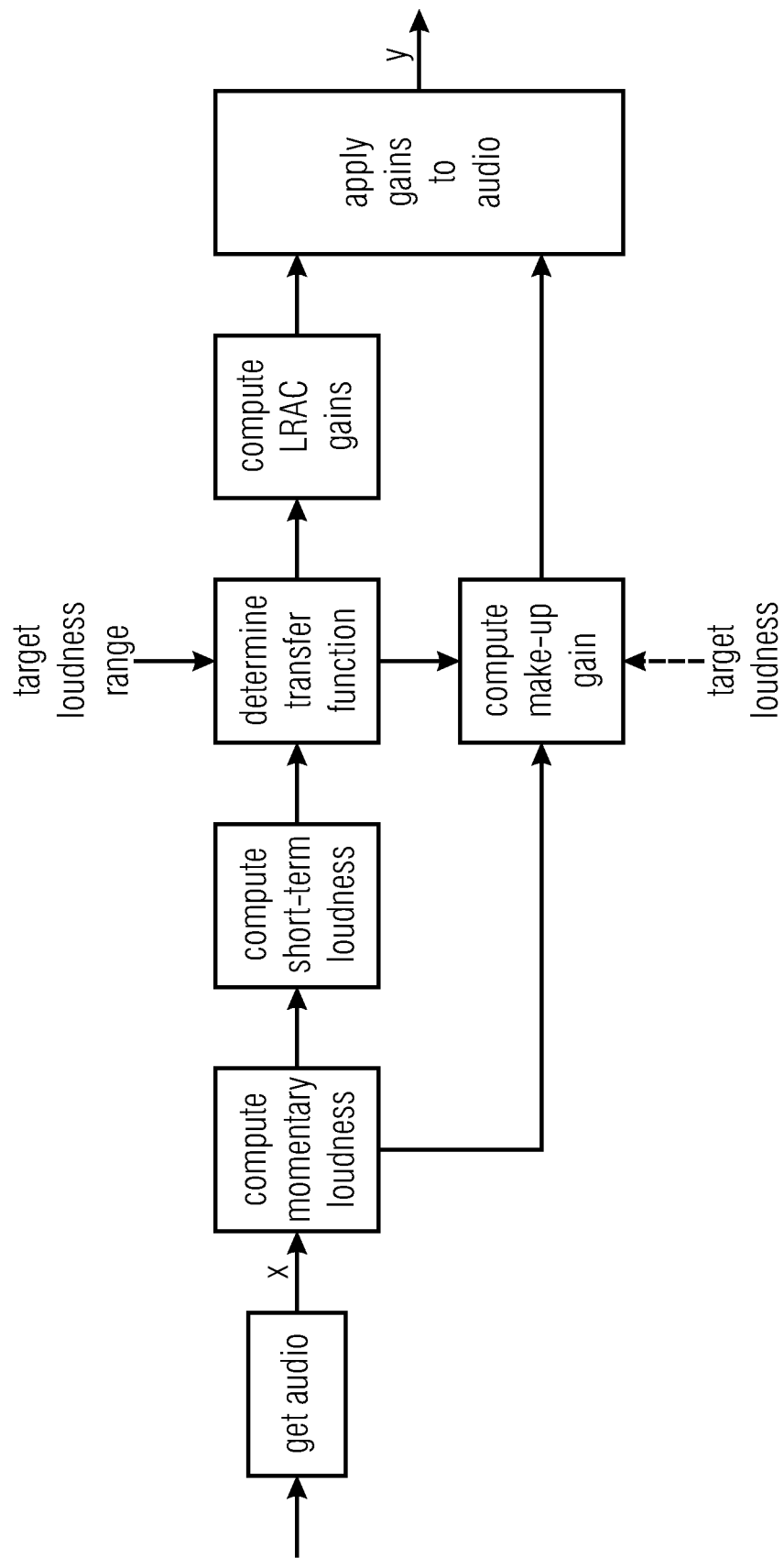
FIG. 4 shows a different block diagram of the steps of the method for processing an input audio signal.

A block diagram of a further embodiment of the inventive LRAC is shown in FIG. 4.

The steps are in this embodiment:
  Get Audio, i.e. get the input audio signal, which is named in the following x.
  Compute Momentary Loudness.
  The computed Momentary Loudness is used for a step: Compute Make-Up Gain which is depending on a Target Loudness set by a user.
  The computed Momentary Loudness is also used for a step: Compute Short-term Loudness which is followed by a step: Determine Transfer Function which is depending on a Target Loudness Range set by a user.
  The determined Transfer Function is submitted to the above mentioned step: Compute Make-up Gain and to the next step of Compute LRAC Gains.
  The LRAC Gains and the Make-up Gain are applied in a next step to the Audio, i.e. to the input audio signal.
  Output the output audio signal, which is named here y.
  The output audio signal y is obtained as $$y = g(LRA_{in}, LRA_{des}, N_{in})x, \qquad (3)$$

where g is the gain applied to the input audio signal x in order to control the loudness range. The gain g is obtained based on the loudness range of the input audio $LRA_{in}$, the desired target loudness range $LRA_{des}$, and the loudness measure over a time period $N_{in}$, e.g., short-term or momentary loudness. This may also be called the actual loudness value which is to be determined by the evaluator or any step evaluating the loudness of the input audio signal. The loudness measure $N_{in}$ is typically time-variant. In one embodiment the gain is additionally obtained based on the determined statistical moment of the loudness value. The statistical moment is, e.g., the mean of the loudness value or the integrated gated loudness of the audio input according to ITU-R BS.1770 [5]).

The gain in dB is $$G(LRA_{in}, LRA_{des}, N_{in}) = 10 \log_{10}(g(LRA_{in}, LRA_{des}, N_{in})). \quad (4)$$

The gain G is obtained in one embodiment based from a mapping function Q that is based on the loudness range of the input audio $LRA_{in}$, the desired target loudness range $LRA_{des}$, and the difference $\Delta N$ between a statistical moment of the loudness measure and the loudness measure:

$$G(LRA_{in}, LRA_{des}, N_{in}) = Q(LRA_{in}, LRA_{des}, \Delta N). \quad (5)$$

In one embodiment, a realization of $\Delta N$ is given by the difference between the mean loudness of the audio input $\mu_{in}$ (or alternatively the integrated gated loudness of the audio input according to ITU-R BS.1770 [5]) and the loudness measure of a period $N_{in}$, i.e.

$$\Delta N = \mu_{in} - N_{in}.$$

The loudness measure of the period $N_{in}$ is such an example of an actual loudness value of a time period or frame of the input audio signal.

In the following, $\mu_{in}$ is in one example the mean loudness of the audio input signal. In different embodiment, $\mu_{in}$ refers to the integrated gated loudness according to ITU-R BS.1770 [5] or a similar rule for determining a long term loudness measure. Generally, $\mu_{in}$ is a statistical moment of the loudness values of the input audio signal.

Alternatively, G is obtained based on the following mapping functions that consist of the superposition of a curve K and a shift $K_{shift}$, where the curve depends on $LRA_{in}$ and $LRA_{des}$ and the shift depends on $\mu_{in}$:

$$G(LRA_{in}, LRA_{des}, N_{in}) = K(LRA_{in}, LRA_{des}, N_{in}) + K_{shift}(\mu_{in}) \quad (6)$$

A suitable choice for the curve K is e.g., a sigmoid function. Equation (6) can be further restricted to the case where the curve K is specified by a slope S:

$$G(LRA_{in}, LRA_{des}, N_{in}) = S(LRA_{in}, LRA_{des}) N_{in} + K_{shift}(\mu_{in}) \quad (7)$$

As can be seen, the mapping function is determined by a slope S and a shift $K_{shift}$.

To avoid excessive amplification of signals with low loudness values, the gain G is subsequently constrained to obtain the final gain:

$$G(LRA_{in}, LRA_{des}, N_{in}) = \min(G(LRA_{in}, LRA_{des}, N_{in}), G_{max}) \quad (8)$$

where $G_{max}$ is the maximum allowed gain. This maximum gain may be defined a priori e.g. by a user or determined based on the input audio signal.

In the following, embodiments for an offline and an online LRAC are discussed.

In the offline version, the entire input audio signal is available. Here, the inventive LRAC is based on the application of a linear transform to the audio signal, on a frame-by-frame basis, in order to achieve loudness range control. In this case the curve is a line with a determined slope.

Some theoretical considerations will be discussed.

Given a normally distributed random variable w with standard deviation $\sigma_w$ and mean $\mu_w$, the application of a linear transfer function, with slope b and shift a, results in a normally distributed random variable $$z = a + bw, \quad (9)$$

The random variable z has a standard deviation $\sigma_z = b \sigma_w$ and mean $\mu_z = a + b \mu_w$.

Two assumptions are made:
1) The loudness measure $N_{in}$ (i.e. the determined actual loudness value of the input audio signal) is a normally distributed random variable.
2) The ratio of the input and output standard deviation is proportional to the ratio of the input and output LRA, i.e., $$b = \frac{\sigma_z}{\sigma_w} = \xi \frac{LRA_z}{LRA_w} \quad (10)$$

where $\xi$ is a proportionality constant, which can be used to compensate for deviations of the audio signal to the model. Usually, the LRA is reduced and therefore $LRA_z < LRA_w$.

The steps for determining the LRAC Gains are as follows:

First, the time dependent loudness measure $N_{in}(k)$ (k is the audio frame index), the mean of the loudness $\mu_{in}$, and the input loudness range (LRA) $LRA_{in}$ are computed from the input audio signal.

It is chosen:

$$b = \xi \frac{LRA_{des}}{LRA_{in}}$$

In one embodiment $\xi = 1$ is set.

The gain can be computed using the following exemplary two methods:

Method 1

Considering equation (5), the function Q is defined as $$Q(LRA_{in}, LRA_{des}, \Delta N(k)) = \frac{(1-b)\Delta N(k)}{\beta(k)} \quad (11)$$

with $$\Delta N(k) = \mu_{in} - N_{in}(k) \quad (12)$$

The normalization term $\beta(k)$ is in one embodiment time-variant. In an embodiment, the following realization is given by:

$$\beta(k) = \begin{cases} \left(1 + \left(\frac{(1-b)\Delta N(k)}{G_{max}}\right)^{\gamma}\right)^{\frac{1}{\gamma}}, & \text{if } (1-b)\Delta N(k) \geq 0 \\ 1, & \text{otherwise} \end{cases}$$

Where $\gamma > 0$ is a real value and the parameter $G_{max}$ is defined in one embodiment a priori by e.g. a user or is determined based on the input audio signal, e.g.

$$G_{max} = |LRA_{des} - LRA_{in}|. \quad (13)$$

Therefore, in this case the gain can be determined by $$G(LRA_{in}, LRA_{des}, N_{in}(k)) = \frac{(1-b)\Delta N(k)}{\beta(k)} \quad (14)$$

In alternative embodiments the normalization parameter is omitted, i.e. $\beta(k) = 1$.

Method 2

Considering equation (7), the functions S and $K_{shift}$ can be defined as $$S(LRA_{in}, LRA_{des}) = b-1 \quad (15)$$

and $$K_{shift}(\mu_{in}) = a \quad (16)$$

where $$a = (1-b)\mu_{in}.$$

This ensures that $\mu_{out} = \mu_{in}$, i.e., the difference between the integrated loudness before and after the loudness processing is minimized.

Therefore, in this case the gain can be determined by $$G(LRA_{in}, LRA_{des}, N_{in}(k)) = (b-1)N_{in}(k) + a \quad (17)$$

With the choice of $a=(1-b)\mu_{in}$ and $b=LRA_{des}/LRA_{in}$ the above equation can alternatively be expressed by $$G(LRA_{in}, LRA_{des}, N_{in}(k)) = (1-b)\Delta N(k) \quad (18)$$

which corresponds to a mapping function that depends on the ratio of the input and output LRA and the difference $\Delta N(k)$ between the mean loudness $\mu_{in}$ and the actual loudness value (e.g. the short-term or momentary loudness measure) of the input audio signal.

The value of the determined gain may then be constrained to a desired maximum value:

$$G(LRA_{in}, LRA_{des}, N_{in}(k)) = \min(G(LRA_{in}, LRA_{des}, N_{in}(k)), G_{max}) \quad (19)$$

Applying the determined loudness range control Gains
The framewise output signal is given by $$y(k) = g(LRA_{in}, LRA_{des}, N_{in}(k))x(k) \quad (20)$$

where $$g(LRA_{in}, LRA_{des}, N_{in}(k)) = 10^{G(LRA_{in}, LRA_{des}, N_{in}(k))/10} \quad (21)$$

In order to further reduce the change in the integrated loudness due to the LRAC processing, a make-up gain is computed in one embodiment by applying the transform directly to the input integrated loudness $I_{in}$ as, for example, in $$G_{mu} = (b-1)I_{in} + a. \quad (22)$$

The gain $g_{mu} = 10^{G_{mu}/10}$ is then applied to the audio signal y. The application of this make-up gain typically results in an integrated loudness deviation of less than 2 LU.

In a further embodiment, applying the transform, the output short-term loudness is given by $$N_{out}(k) = a + b\ N_{in}(k)$$

where k is a frame index.

Based on the foregoing, LRAC Gains are computed:
The LRAC gains, in dB, are computed as $$G(k) = N_{out}(k) - N_{in}(k) = a + (b-1)N_{in}(k).$$

To avoid excessive amplification of signals with low short-term loudness values, the gain is subsequently constrained in one embodiment as follows:

$$G(k) = \min(G(k), G_{max}),$$

where $G_{max}$ is the maximum allowed gain. This maximum gain is defined—depending on the embodiment—a priori or determined based on the audio signal, e.g., $$G_{max} = |LRA_{des} - LRA_{in}|.$$

In order to further reduce the change in the integrated loudness due to the LRAC processing, a make-up gain is computed in one embodiment by applying the transform directly to the input integrated loudness $I_{in}$ as in $$G_{mu} = a + (b-1)I_{in}.$$

Figure 5A:
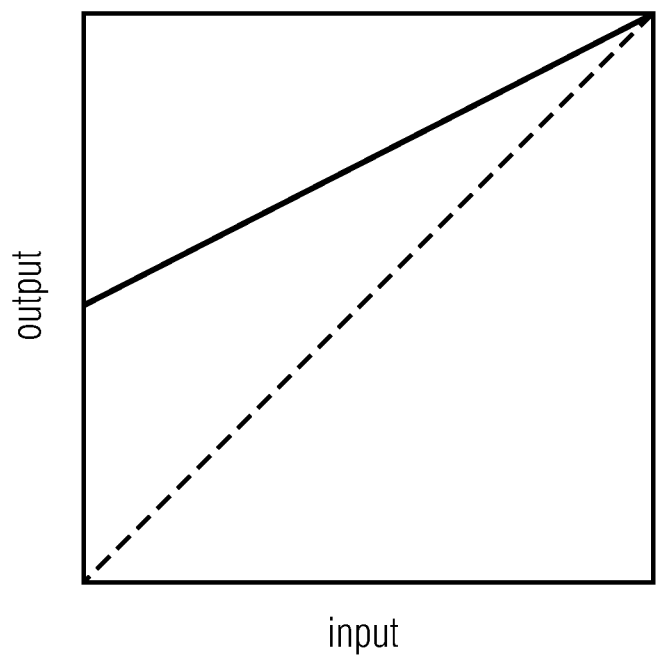
FIG. 5a shows a transfer function with slope.
Figure 5B:
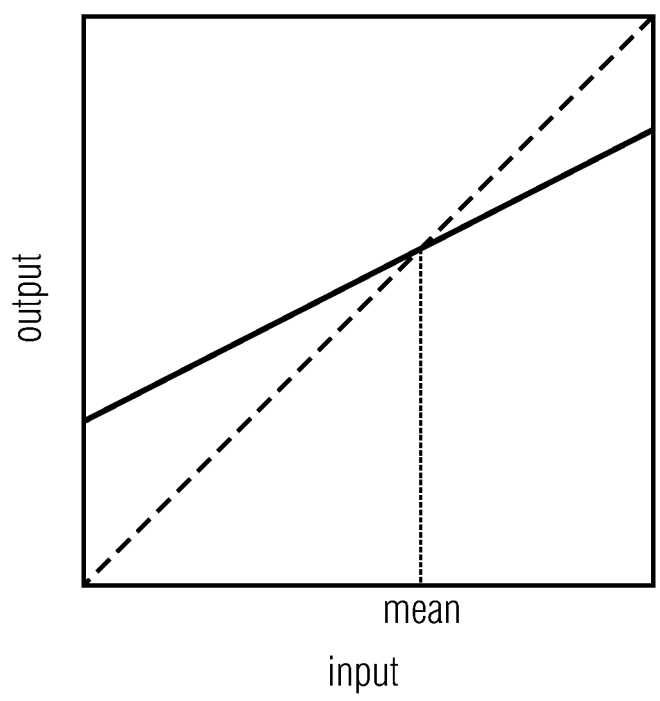
FIG. 5b shows a transfer function with slope and shift.

This make-up gain $G_{mu}$ is then applied to the audio signal.
Some aspects of the offline processing are as follows:
A linear transfer function is computed with a slope b and a shift a determined from a statistical analysis of the audio signal as depicted in FIGS. 5a and 5b. Loudness range control (LRAC) gains are computed based on this transfer function.

The slope b of the linear transfer function is a function of the input LRA and the desired target LRA set by a user. Computing and applying LRAC gains, based on a transfer function that is only dependent on the slope as depicted in FIG. 5a to the input audio signal would achieve the desired effect of controlling the LRA. However, this would lead to a significant difference between the input and output loudness. In addition, it would lead to exceedingly high amplification of the segments with low loudness levels and amplification of segments with high loudness levels which may lead to clipping or undesired modulation artifacts in the processed input audio signal.

The combination of slope b and shift a leads to a transfer function as depicted in FIG. 5b. The final LRAC gains are determined from this transfer function. The shift a ensures that the mean of the loudness distribution is maintained and therefore the resulting difference between the input and output loudness is small. In addition, this automatically reduces the gain applied to segments with low loudness levels and avoids amplification of segments with high loudness levels thus avoiding clipping and modulation.

Subsequent constraining of the determined LRAC gains in some embodiments is a postprocessing step which insures that the low level audio such as background noise is not amplified excessively. Due to the shift a, the obtained gains remain in a reasonable range from the very beginning and a suitable maximum gain can be defined a priori.

Figure 6:
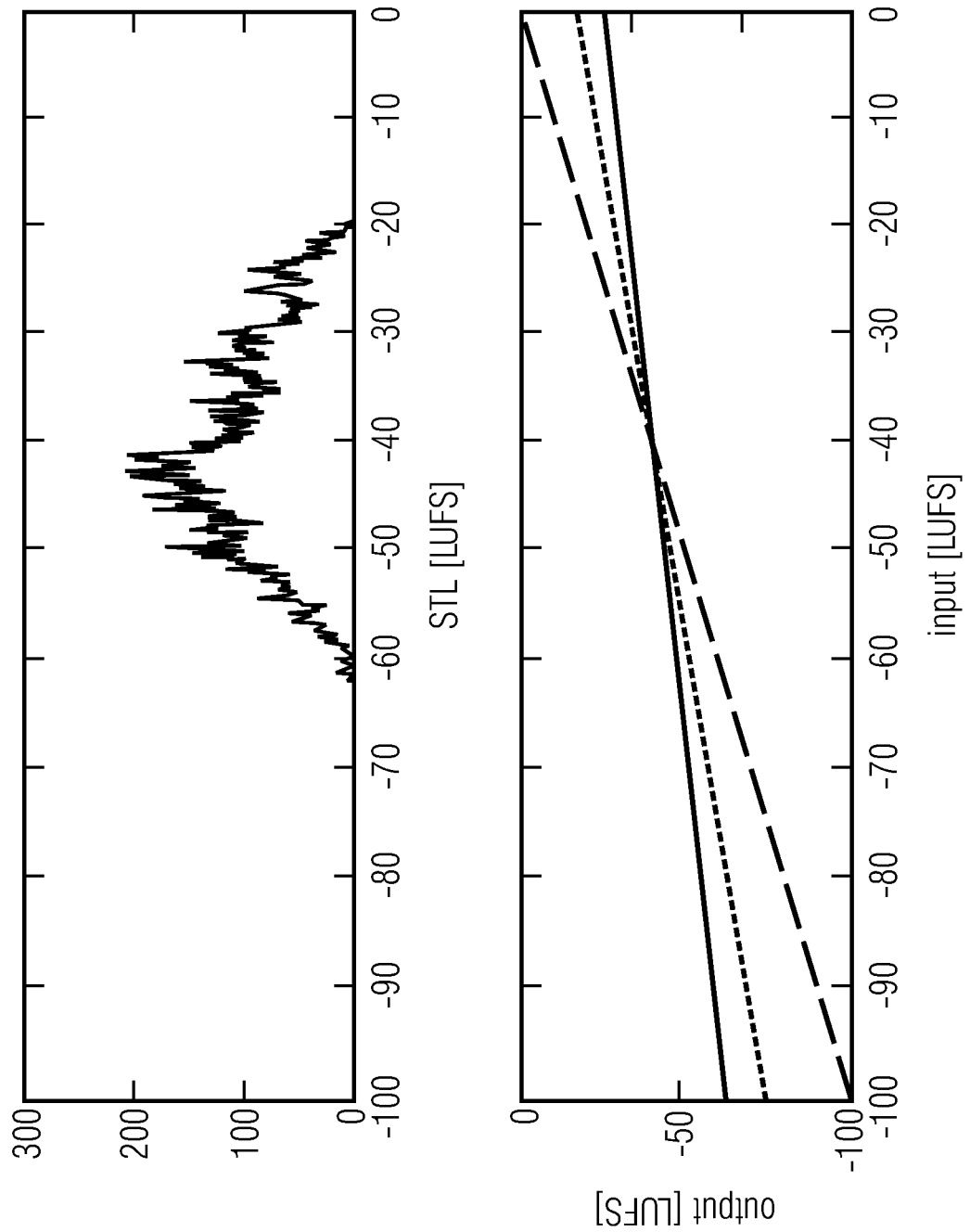
FIG. 6 depicts (upper diagram) a short-term loudness histogram of a one hour audio segment of a movie and (lower diagram) two different transfer functions and FIG. 7 shows an exemplary histogram, different transfer functions according to conventional technology and a transfer function according to the invention.

An exemplary histogram of the short-term loudness values of an audio excerpt of a movie and gain functions corresponding to different desired LRAs are depicted in FIG. 6. Shown are a short-term loudness histogram of a one hour audio segment of a movie with an LRA of 22.8 LU (top row). Also shown are transfer functions for two desired LRAs of 10 LU and 15 LU, respectively (bottom row).

In an embodiment a Loudness Normalization Gain is computed:

The application of the inventive LRAC method may lead to a change in the integrated loudness of the audio. A gain can be computed in order to achieve a desired target integrated loudness.

If the desired target loudness is chosen to be equal to the input loudness, a normalization gain can be obtained by computing the difference between the measured input integrated loudness $I_{in}$ and the measured or estimated output integrated loudness. The output integrated loudness can be estimated using the output momentary loudness values that are obtained from applying the transformation to the input momentary loudness values. Otherwise the normalization gain is computed from the difference between the estimated or measured output integrated loudness and the desired target integrated loudness.

An online LRAC can be derived from the offline version. The online version considers temporal segments of the audio signal for the input LRA and mean loudness estimation instead of the entire audio signal. In this case the parameters become time-dependent, i.e., $a(k)=(1-b(k))\mu_{in}(k)$, which insures that the statistical moment of the input loudness equals the corresponding statistical moment of the output loudness, e.g. the mean loudness values: $\mu_{out}(k)=\mu_{in}(k)$. Further, $b(k)=\xi LRA_{des}/LRA_{in}(k)$.

The two online methods are therefore:

Method 1

The function Q is defined as $$Q(LRA_{in}, LRA_{des}, \Delta N(k)) = \frac{(1-b(k))\Delta N(k)}{\beta(k)} \quad (23)$$

with $$\Delta N(k) = \mu_{in}(k) - N_{in}(k) \quad (24)$$

and $$\beta(k) = \begin{cases} \left(1 + \left(\frac{(-b(k))\Delta N(k)}{G_{max}(k)}\right)^{\gamma}\right)^{\frac{1}{\gamma}}, & \text{if } (1-b(k))\Delta N(k) \geq 0 \\ 1, & \text{otherwise} \end{cases}$$

with where $\gamma>0$ is a real value and the parameter $G_{max}(k)$ is defined in one embodiment as a time-independent user defined parameter $G_{max}(k)=G_{max}$ or it is a signal dependent parameter $G_{max}(k)=|LRA_{des}-LRA_{in}(k)|$.

Therefore, in this case the gain can be determined by $$G(LRA_{in}, LRA_{des}, N_{in}(k)) = \frac{(1-b(k))\Delta N(k)}{\beta(k)} \quad (25)$$

Method 2

The functions S and $K_{shift}(\mu_{in}(k))$ are defined as $$S(LRA_{des}, LRA_{in}(k))=b(k)-1 \quad (26)$$

and $$K_{shift}(\mu_{in}(k))=a(k) \quad (27)$$

The LRAC gain is then computed as $$G(LRA_{des}, LRA_{in}(k), N_{in}(k))=(b(k)-1)N_{in}(k)+a(k) \quad (28)$$

To avoid excessive amplification the gain is subsequently constrained as follows:

$$G(LRA_{des}, LRA_{in}(k), N_{in}(k))=\min(G(LRA_{des}, LRA_{in}(k), N_{in}(k)), G_{max}(k)) \quad (29)$$

In a further embodiment, the transform parameters are computed as $$b(k) = \xi \frac{LRA_{des}}{LRA_{in}(k)}$$

and $$a(k) = (1-b(k))\mu_{in}(k)$$

which insures that $\mu_{out}(k)=\mu_{in}(k)$.

Applying the transform, the output short-term loudness is given by:

$$N_{out}(k)=a(k)+b(k)N_{in}(k).$$

The LRAC gain is then computed as $$G(k)=N_{out}(k)-N_{in}(k)=a(k)+(b(k)-1)N_{in}(k)$$

To avoid excessive amplification of signals with low short-term loudness values, the gain is subsequently constrained in one embodiment as follows:

$$G(k)=\min(G(k), G_{max}(k)).$$

where $G_{max}(k)$ is one embodiment a fixed time-independent user defined parameter $G_{max}(k)=G_{max}$ and is in a different embodiment a signal dependent parameter $G_{max}(k)=|LRA_{des}-LRA_{in}(k)|$. Therefore, the online LRAC considers temporal segments of the input audio signal instead of the entire duration of the input audio signal.

One embodiment of the inventive method comprises the following steps:

1) Receive an input audio signal.
2) Compute momentary or short-term loudness values as examples of the actual loudness value—for a sequence of audio frames.
3) Determine the input loudness range (LRA) from the ensemble of computed momentary or short-term loudness values.
4) Determine a compressor transfer function based on a slope b and a shift a. Determine the slope b from the input LRA and the desired target LRA, and the shift a from the statistical moment of the loudness values.

Alternatively: Determine a compressor transfer function based on the input LRA, the desired LRA and the difference between the momentary or short-term loudness values and a statistical moment of the loudness values.

Alternatively: Determine a compressor transfer function based on a curve and a shift. Determine the curve from the input LRA and the desired LRA, and the shift from the statistical moment of the loudness values.
5) Compute time variant LRAC gains based on the determined compressor transfer function.
6) Determine an output audio signal by applying the LRAC gains to the audio samples of the input audio signal.

In an embodiment, the following steps are given: Determine a compressor transfer function based on a slope and a shift. Determine the slope from the input LRA and the desired LRA, and the shift from the computed momentary or short-term loudness values.

An embodiment comprises the step: Determine a threshold point of the compressor transfer function below which the transfer function has a different slope than the slope determined from the input and desired output LRA. This corresponds to implementing a constraint on the minimum compressor gain.

A further embodiment comprises the step: Determine or define (heuristically) a maximum gain constraint to be applied to the computed LRAC gains.

In another embodiment, the following steps are included: Compute a loudness control gain to obtain a desired target loudness of the output signal based on the momentary loudness values and the LRAC gains. Determine an output audio signal by applying the LRAC gains and the loudness control gain (or a combination of both) to the audio samples of the input audio signal.

Figure 7:
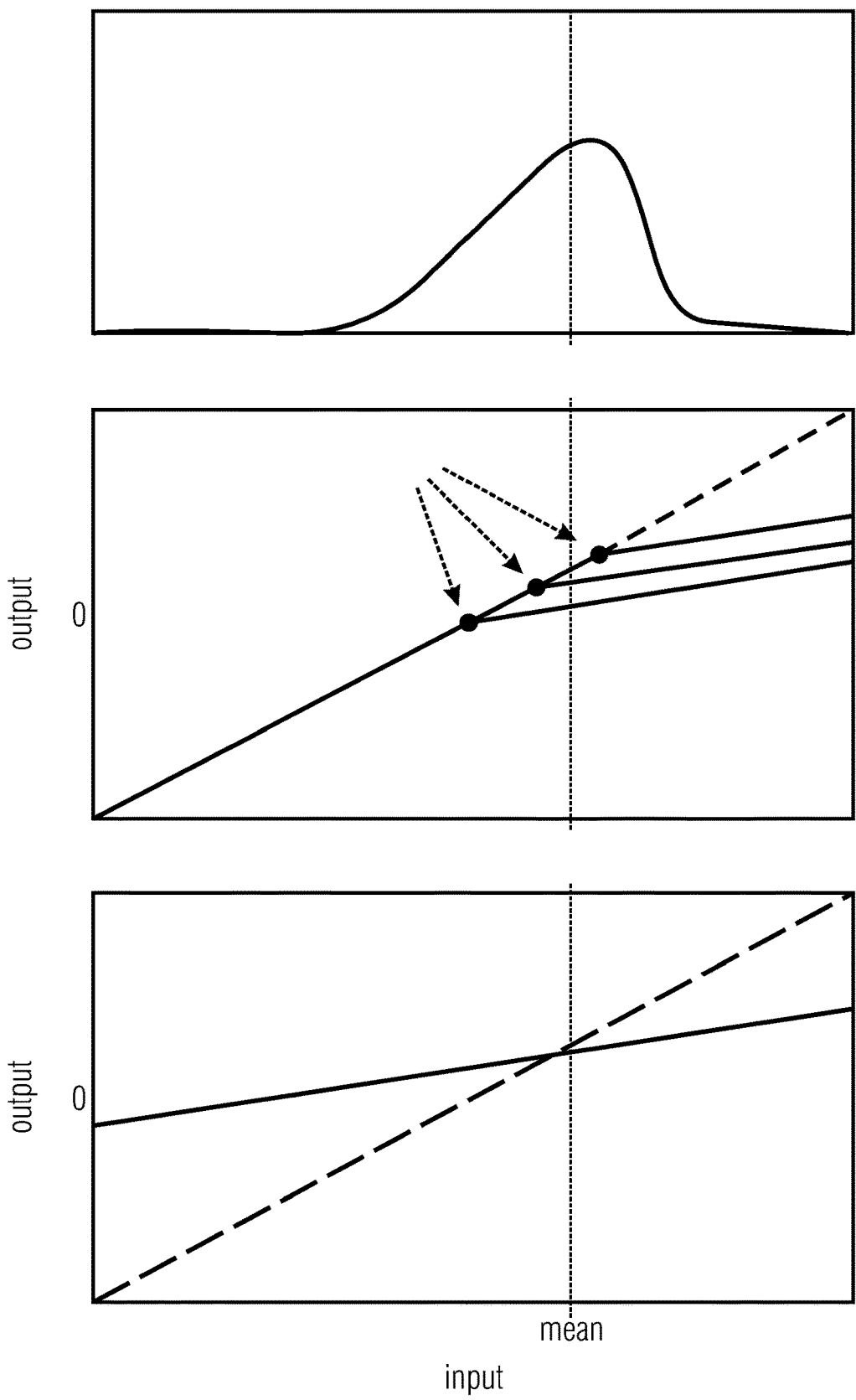

In FIG. 7 an exemplary histogram is shown in the upper diagram. The diagram in the middle shows transfer functions for conventional-technology [4] dynamic spread control method. The lower diagram gives a transfer function according to the invention. The transfer functions are shown in diagrams with the input loudness on the x-axis and the output loudness on the y-axis. Marked is in all three diagrams the mean loudness.

The method proposed in [4] involves two parameters, i.e., the threshold point and slope. The threshold point (marked by the dots and the arrows) is a user defined parameter which is selected as a percentile of the loudness distribution. This means the threshold value in dB changes for different types of input audio. However, if the chosen threshold point then lies close to the mean, this may lead to artifacts in the audio due to the non-linear part of the transfer function. In addition, if a high threshold is selected then a larger slope might be used for achieving a desired dynamic spread. However, the slope is computed based on the input and desired dynamic spread and is not dependent on the chosen threshold point. The above considerations show that this may not be sufficient depending on the selected threshold. That is why an iterative computation of the slope may be used.

The proposed invention does not require the user or iteration processing to determine the appropriate transfer function. All parameters that may be used are automatically determined from the input signal and the desired LRA.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive transmitted or encoded signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive method is, therefore, a data carrier (or a non-transitory storage medium such as a digital storage medium, or a computer-readable medium) comprising, recorded thereon, the computer program for performing one of the methods described herein. The data carrier, the digital storage medium or the recorded medium are typically tangible and/or non-transitory.

A further embodiment of the invention method is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] EBU Tech Doc 3342 Loudness Range: A Descriptor to supplement Loudness Normalization in accordance with EBU R 128 (2016)
[2] U.S. Pat. No. 8,229,125 B2
[3] US 2014/0369527 A1
[4] U.S. Pat. No. 7,848,531 B1
[5] ITU-R, Recommendation ITU-R BS.1770-3. Algorithm to measure audio programme loudness and true-peak audio level, August 2012.
[6] EBU Tech Doc 3341 Loudness Metering: 'EBU Mode' metering to supplement loudness normalisation in accordance with EBU R 128

The invention claimed is:
1. Apparatus for processing an input audio signal, comprising an evaluator, a calculator and an adjuster,
wherein the evaluator is configured to evaluate a loudness of the input audio signal to determine a loudness range and an actual loudness value,
wherein the calculator is configured to determine a compressor transfer function based on the determined loud- ness range, based on a target loudness range and based on the determined actual loudness value, wherein the calculator is configured to determine at least one loudness range control gain based on the determined compressor transfer function, and wherein the adjuster is configured to provide an output audio signal based on the input audio signal and based on the at least one determined loudness range control gain, wherein the calculator is configured to determine the compressor transfer function such that a difference between a mean loudness of the output audio signal and a mean loudness of the input audio signal is minimized.

2. Apparatus of claim 1, wherein the evaluator is configured to evaluate the loudness of the input audio signal to determine a statistical moment of the loudness value, wherein the calculator is configured to determine the compressor transfer function based on the determined loudness range, based on the target loudness range and based on a difference between the determined actual loudness value and the determined statistical moment of the loudness value.

3. Apparatus of claim 2, wherein the calculator is configured to determine the compressor transfer function based on a curve and a shift, wherein the calculator is configured to determine the curve based on the determined loudness range and on the target loudness range, and wherein the calculator is configured to determine the shift based on the determined statistical moment of the loudness value.

4. Apparatus of claim 2, wherein the calculator is configured to determine the compressor transfer function based on a slope and a shift, wherein the calculator is configured to determine the slope based on the determined loudness range and on the target loudness range, and wherein the calculator is configured to determine the shift based on the determined statistical moment of the loudness value.

5. Apparatus of claim 4, wherein the determined compressor transfer function is valid for the entire input audio signal.

6. Apparatus of claim 1, wherein the evaluator is configured to evaluate the loudness of the entire input audio signal.

7. Apparatus of claim 1, wherein the evaluator is configured to evaluate the loudness of at least a time period of the input audio signal.

8. Apparatus of claim 1, wherein the evaluator is configured to determine momentary or short-term loudness value as the actual loudness value.

9. Apparatus of claim 2, wherein the evaluator is configured to determine a mean loudness as the statistical moment of the loudness value, or wherein the evaluator is configured to determine an integrated gated loudness as the statistical moment of the loudness value.

10. Apparatus of claim 1, wherein the calculator is configured to determine the compressor transfer function such that the mean loudness of the output audio signal and the mean loudness of the input audio signal are equal.

11. Apparatus of claim 1, wherein the calculator is configured to determine the loudness range control gain based on the determined compressor transfer function and based on a maximum gain value such that the determined loudness range control gain is smaller than or equal to the maximum gain value.

12. Apparatus of claim 11, wherein the maximum gain value is set by a user input, or wherein the maximum gain value is depending on a difference between the target loudness range and the determined loudness range of the input audio signal.

13. Apparatus of claim 1, further comprising an input interface, wherein the input interface is configured to receive a value for the target loudness range.

14. Method for processing an input audio signal, comprising:

evaluating a loudness of the input audio signal to determine a loudness range and an actual loudness value, determining a compressor transfer function based on the determined loudness range, based on a target loudness range and based on a determined statistical moment of the loudness value, determining at least one loudness range control gain based on the determined compressor transfer function, and providing an output audio signal based on the input audio signal and based on the at least one determined loudness range control gain, wherein the compressor transfer function is determined such that a difference between a mean loudness of the output audio signal and a mean loudness of the input audio signal is minimized.

15. A non-transitory digital storage medium having a computer program stored thereon to perform the method for processing an input audio signal, said method comprising:

evaluating a loudness of the input audio signal to determine a loudness range and an actual loudness value, determining a compressor transfer function based on the determined loudness range, based on a target loudness range and based on a determined statistical moment of the loudness value, determining at least one loudness range control gain based on the determined compressor transfer function, and providing an output audio signal based on the input audio signal and based on the at least one determined loudness range control gain, wherein the compressor transfer function is determined such that a difference between a mean loudness of the output audio signal and a mean loudness of the input audio signal is minimized, when said computer program is run by a computer.

* * * * *